(12) United States Patent
Jang et al.

(10) Patent No.: US 12,105,371 B2
(45) Date of Patent: Oct. 1, 2024

(54) DISPLAY APPARATUS

(71) Applicant: SAMSUNG ELECTRONICS CO., LTD., Suwon-si (KR)

(72) Inventors: Naewon Jang, Suwon-si (KR); Kihyung Kang, Suwon-si (KR); Sungho Kim, Suwon-si (KR); Sanghyun Sohn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 17/994,120

(22) Filed: Nov. 25, 2022

(65) Prior Publication Data

US 2023/0244099 A1 Aug. 3, 2023

Related U.S. Application Data

(63) Continuation of application No. PCT/KR2022/017631, filed on Nov. 10, 2022.

(30) Foreign Application Priority Data

Jan. 28, 2022 (KR) .................. 10-2022-0013556

(51) Int. Cl.
*G02F 1/1335* (2006.01)
*G02F 1/1333* (2006.01)
*G02F 1/13363* (2006.01)

(52) U.S. Cl.
CPC .. *G02F 1/133504* (2013.01); *G02F 1/133531* (2021.01); *G02F 1/13363* (2013.01); *G02F 1/133345* (2013.01); *G02F 1/133528* (2013.01)

(58) Field of Classification Search
CPC ............ G02F 1/1333; G02F 1/133345; G02F 1/1335; G02F 1/133502; G02F 1/133504; G02F 1/133528; G02F 1/133553; G02F 1/133531; G02F 1/13363
See application file for complete search history.

(56) References Cited

U.S. PATENT DOCUMENTS

| 7,245,433 B2 | 7/2007 | Yano et al. |
| 8,163,372 B2 | 4/2012 | Furui et al. |
| 9,915,759 B2 | 3/2018 | Park et al. |
| 2007/0184212 A1* | 8/2007 | Nimura ............... G02B 5/3033 428/1.31 |

(Continued)

FOREIGN PATENT DOCUMENTS

| JP | 2004-094191 A | 3/2004 |
| JP | 2008-3541 A | 1/2008 |

(Continued)

OTHER PUBLICATIONS

Patent Translate JP 2009156939 (Tsutomu, Jul. 16, 2009).*

(Continued)

*Primary Examiner* — Thoi V Duong
(74) *Attorney, Agent, or Firm* — Sughrue Mion, PLLC

(57) ABSTRACT

A display apparatus includes a display panel including a first optical film. The first optical film includes: a biaxially elongated polyethylene terephthalate (PET) film; a scattering layer provided on the biaxially elongated PET film and having a haze value between 40% and 60%, the haze value representing a scattering rate of light; and a low-reflective layer provided on the scattering layer.

18 Claims, 14 Drawing Sheets

(56) References Cited

U.S. PATENT DOCUMENTS

| | | | | |
|---|---|---|---|---|
| 2012/0176573 A1* | 7/2012 | Kuze | ............ | G02B 5/0231 |
| | | | | 264/1.6 |
| 2017/0352689 A1* | 12/2017 | Chung | ............ | G02F 1/1368 |
| 2018/0013099 A1* | 1/2018 | Harkema | ............ | H10K 50/858 |
| 2020/0341316 A1* | 10/2020 | Kim | ............ | C08L 67/02 |

FOREIGN PATENT DOCUMENTS

| | | | |
|---|---|---|---|
| JP | 2009-156938 A | 7/2009 | |
| JP | 2009-156939 A | 7/2009 | |
| JP | 2009-169389 A | 7/2009 | |
| JP | 2012-212120 A | 11/2012 | |
| JP | 2012-212122 A | 11/2012 | |
| KR | 10-1989-0004356 B1 | 10/1989 | |
| KR | 10-1718864 B1 | 3/2017 | |
| KR | 10-1795110 B1 | 11/2017 | |
| KR | 10-2160091 B1 | 9/2020 | |
| WO | 2008/020587 A1 | 2/2008 | |

OTHER PUBLICATIONS

International Search Report (PCT/ISA/210) issued by the International Searching Authority on Feb. 17, 2023 in corresponding International Application No. PCT/KR2022/017631.

Written Opinion (PCT/ISA/237) issued by the International Searching Authority on Feb. 17, 2023 in corresponding International Application No. PCT/KR2022/017631.

* cited by examiner

FIG. 3
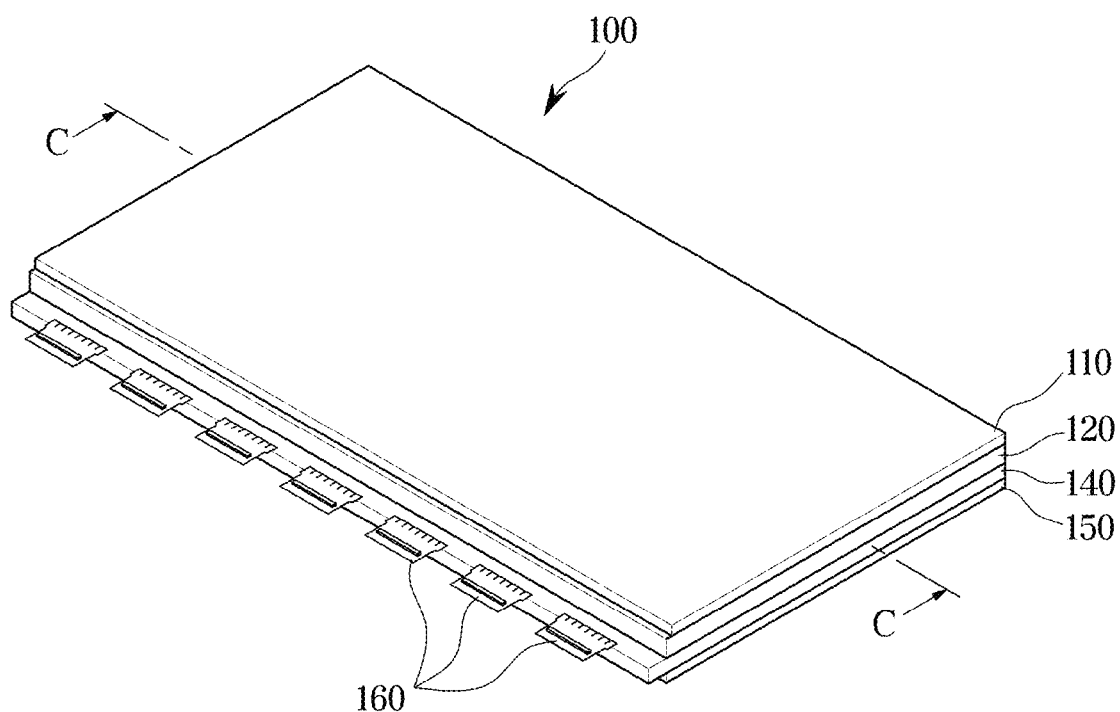
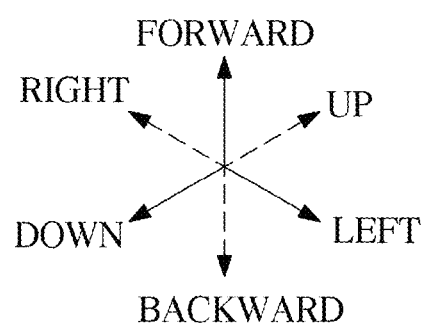

FIG. 7

| Haze | ~40% | ~60% | ~80% |
|---|---|---|---|
|  |  |  |  |
| CONTRAST RATIO | 95% | 85% | 75% |

DISPLAY APPARATUS

CROSS-REFERENCE TO RELATED APPLICATIONS

This application is a by-pass continuation application of International Application No. PCT/KR2022/017631, filed on Nov. 10, 2022, which is based on and claims priority to Korean Patent Application No. 10-2022-0013556 filed on Jan. 28, 2022, the disclosures of which are incorporated by reference herein in their entireties.

BACKGROUND

1. Field

The disclosure relates to a display apparatus, and more particularly, to a display apparatus including a liquid crystal panel and a light source device.

2. Description of Related Art

In general, display apparatuses are a type of output devices for displaying electrical information received from outside or stored inside for the user by converting the electrical information to visual information, and are used in various fields such as homes or work places.

There are many different display apparatuses such as monitor devices connected to personal computers (PCs) or server computers, portable computer systems, Global Positioning System (GPS) terminals, general television sets, Internet protocol televisions (IPTVs), portable terminals, e.g., smart phones, tablet PCs, personal digital assistants (PDAs), and cellular phones, any other display device for reproducing images like advertisements or films, or other various kinds of audio/video systems.

The display apparatus may include a display panel for displaying an image, and reflection of external light may occur on the display panel. Due to overlapping of a displayed image and a reflected image, quality of the image displayed on the display apparatus may be degraded. Furthermore, rainbow mura may be caused by birefringence of light on the display panel. This may deteriorate the quality of the image displayed on the display panel.

SUMMARY

Provided is a display apparatus capable of reducing optical mura caused by reflection and birefringence of external light.

Further, provided is a display apparatus capable of reducing optical mura caused by reflection and birefringence of external light and including an inexpensive optical film.

According to an aspect of the disclosure, a display apparatus includes a display panel having a first optical film where the first optical film includes a low-reflective layer, a scattering layer having a haze value between 40% and 60%, the haze value representing a scattering rate of light, and a biaxially elongated polyethylene terephthalate (PET) film.

According to an aspect of the disclosure, a display apparatus includes: a display panel including a first optical film, wherein the first optical film includes: a biaxially elongated polyethylene terephthalate (PET) film; a scattering layer provided on the biaxially elongated PET film and having a haze value between 40% and 60%, the haze value representing a scattering rate of light; and a low-reflective layer provided on the scattering layer.

The haze value of the scattering layer may be 50%.

The scattering layer may include a plurality of particles dispersed on the biaxially elongated PET film.

A size of each of the plurality of particles may be between 1 micrometer and 100 micrometers.

The plurality of particles are dispersed on the biaxially elongated PET film at a dispersion density of 2 to 5 particles per 1 square millimeter.

A surface of the scattering layer may include a transparent resin has bumps formed thereon by an imprinting method.

The scattering layer may include a thermosetting resin layer.

The biaxially elongated PET film may include an ultraviolet absorber.

The first optical film may further include a viewing angle enhancement film, and the biaxially elongated PET film may be provided on the viewing angle enhancement film.

The display panel may further include: a second optical film; and a first polarizer film including a polarizer provided between the first optical film and the second optical film.

The display panel may further include a third optical film provided between the first optical film and the polarizer.

The third optical film may include a tri-acetyl cellulose (TAC) film.

The third optical film may include a uniaxially elongated polyethylene terephthalate (PET) film.

The display panel may further include: a first transparent substrate; a second transparent substrate; a liquid crystal layer provided between the first transparent substrate and the second transparent substrate; and a second polarizer film provided on an outer side of the second transparent substrate, and the first polarizer film may be provided on an outer side of the first transparent substrate.

The second optical film may include a tri-acetyl cellulose (TAC) film.

The display panel may further include: a first transparent substrate; a second transparent substrate; and an inorganic light emitting layer provided between the first transparent substrate and the second transparent substrate, the inorganic light emitting layer may include a plurality of light emitting diode devices, and the first polarizer film may be provided on an outer side of the first transparent substrate.

The second optical film may include a phase retardation film.

The display panel may further include: a first transparent substrate; a second transparent substrate; and an organic light emitting layer provided between the first transparent substrate and the second transparent substrate, the organic light emitting layer may include an organic metal compound, and the first polarizer film may be provided on an outer side of the first transparent substrate.

The second optical film may include a phase retardation film.

The display panel may further include: a first transparent substrate; a second transparent substrate; and a quantum dot (QD) layer provided between the first transparent substrate and the second transparent substrate, the QD layer may include a plurality of QD materials, and the first polarizer film may be provided on an outer side of the first transparent substrate.

According to an embodiment of the disclosure, a display apparatus capable of reducing optical mura caused by reflection and birefringence of external light may be provided. This may improve the quality of an image displayed on the display apparatus.

According to an embodiment of the disclosure, a display apparatus capable of reducing optical mura caused by reflection and birefringence of external light and including an inexpensive optical film may be provided. Accordingly, an inexpensive display apparatus may be provided.

According to an embodiment of the disclosure, a display apparatus capable of reducing optical mura caused by reflection and birefringence of external light may be provided. This may improve the quality of an image displayed on the display apparatus.

According to an embodiment of the disclosure, a display apparatus capable of reducing optical mura caused by reflection and birefringence of external light and including an inexpensive optical film may be provided. Accordingly, an inexpensive display apparatus may be provided.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 shows an example of a liquid crystal panel included in a display apparatus, according to an embodiment of the disclosure;

FIG. 7 shows an example of color mura and contrast depending on haze values of a first optical film included in a display apparatus, according to an embodiment of the disclosure;

DETAILED DESCRIPTION

Figure 1:
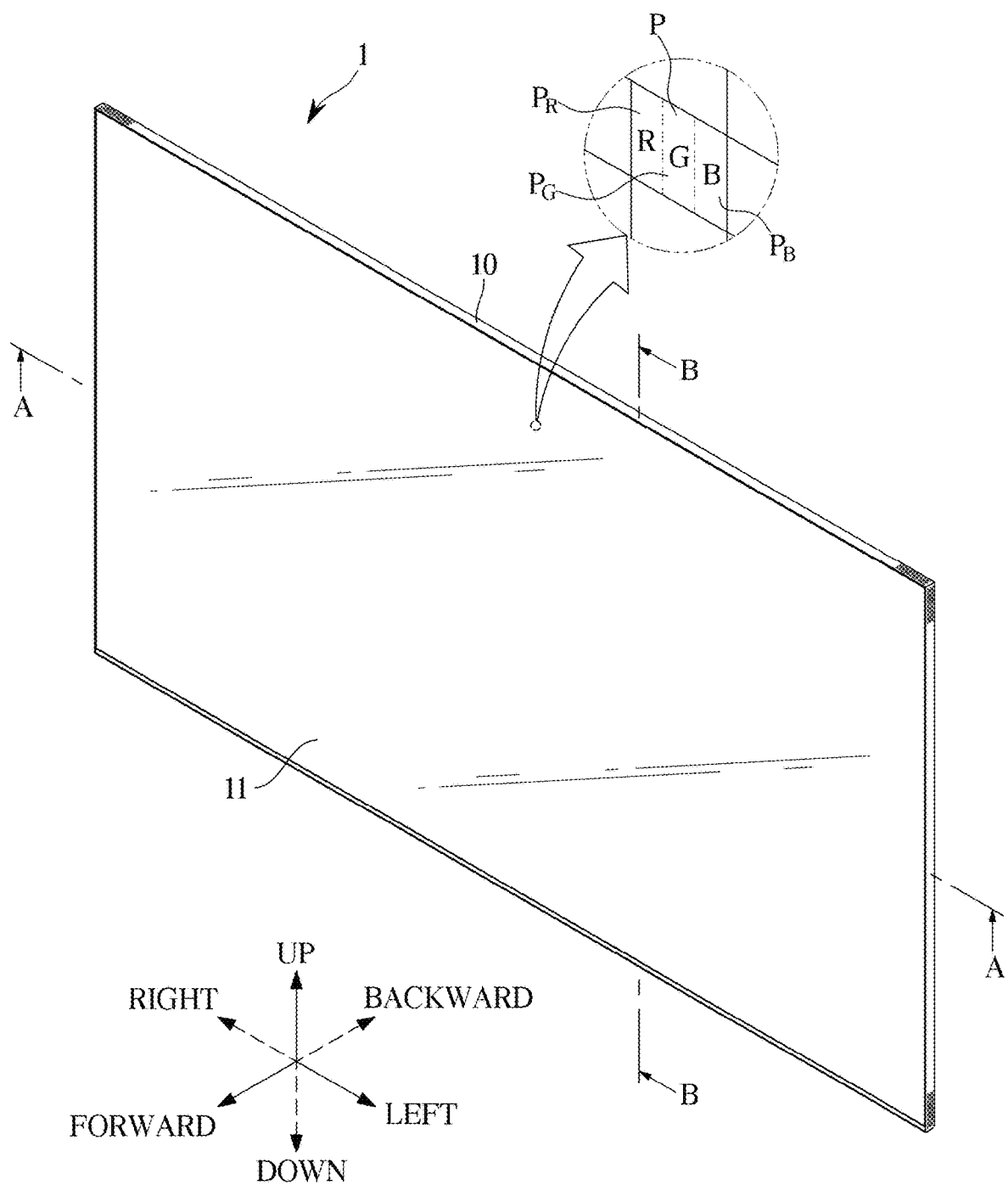
FIG. 1 shows an example of an exterior of a display apparatus, according to an embodiment of the disclosure.

Like numerals refer to like elements throughout the specification and drawings. Not all elements of embodiments of the disclosure will be described, and description of what are commonly known in the art or what overlap each other in the embodiments will be omitted. The term 'unit, module, member, or block' may refer to what is implemented in software or hardware, and a plurality of units, modules, members, or blocks may be integrated in one component or the unit, module, member, or block may include a plurality of components, depending on the embodiment of the disclosure.

It will be further understood that the term "connect" or its derivatives refer both to direct and indirect connection, and the indirect connection includes a connection over a wireless communication network.

The term "include (or including)" or "comprise (or comprising)" is inclusive or open-ended and does not exclude additional, unrecited elements or method steps, unless otherwise mentioned.

Throughout the specification, when it is said that a member is located "on" another member, it implies not only that the member is located adjacent to the other member but also that a third member exists between the two members.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise.

The principle and embodiments of the disclosure will now be described with reference to accompanying drawings.

FIG. 1 illustrates an exterior of a display apparatus, according to an embodiment of the disclosure.

A display apparatus 1 is a device that is able to process image signals received from the outside and visually present the processed image. In the following description, it is assumed that the display apparatus 1 is a television (TV), but embodiments of the disclosure are not limited thereto. For example, the display apparatus 1 may be implemented in various forms such as a monitor, a portable multimedia device, a portable communication device, and any device capable of visually presenting images without being limited thereto.

The display apparatus 1 may be a large format display (LFD) installed outdoors such as on a rooftop of a building or at a bus stop. However, the display apparatus 1 is not limited to being installed outdoors, but may be installed at any place, even indoors, e.g., at subway stations, shopping malls, theaters, offices, stores, etc.

The display apparatus 1 may receive contents including video and audio signals from various content sources and output video and audio corresponding to the video and audio signals. For example, the display apparatus 1 may receive content data through a broadcast receiving antenna or a cable, receive content data from a content reproducing device, or receive content data from a content providing server of a content provider.

As shown in FIG. 1, the display apparatus 1 may include a main body 10 and a screen 11 for displaying an image.

The main body 10 forms the exterior of the display apparatus 1, and components for the display apparatus 1 to display the image or perform many different functions may be included in the main body 10. Although the main body 10 of FIG. 1 is shaped like a flat plate, it is not limited thereto. For example, the main body 10 may have the form of a curved plate.

The screen 11 is formed on the front surface of the main body 10. "Forward" or "front" as herein used may refer to a direction or side on which the screen 11 is formed with respect to the main body 10. "Back", "top", "bottom", "left" and "right" may be defined from a point that views the display apparatus 1.

The screen 11 may display a still image or a moving image. The screen 11 may also display two dimensional (2D) plane images, or three dimensional (3D) stereographic images using parallax of both eyes of the user.

The screen 11 may include, e.g., a self-luminous display panel (e.g., an inorganic light emitting diode (LED) panel or an organic LED (OLED) panel) capable of emitting light at first hand, or non-luminous display panel (e.g., a liquid crystal display (LCD) panel) capable of passing or blocking light emitted from, e.g., a light source device (e.g., a backlight unit).

A plurality of pixels P are formed on the screen 11, and the image displayed on the screen 11 may be formed by the light emitted by each of the plurality of pixels P. For example, the light emitted by the plurality of pixels P may be combined like a mosaic into the image on the screen 11.

The plurality of pixels P may emit light in various colors and brightnesses. Each of the plurality of pixels P may include subpixels PR, PG and Pb to emit different colors of light.

The subpixels PR, PG, and PB may include a red subpixel PR to emit red light, a green subpixel PG to emit green light, and a blue subpixel PB to emit blue light. For example, the red light may represent light having wavelengths in the range of about 620 nanometer (nm) to about 750 nm, where 1 nm is a billionth of a meter. The green light may have wavelengths in the range of about 495 nm to 570 nm. The blue light may have wavelengths in the range of about 450 nm to 495 nm.

By combinations of the red light of the red subpixel PR, the green light of the green subpixel PG, and the blue light of the blue subpixel PB, each of the plurality of pixels P may emit various brightnesses and colors of light.

Figure 2:
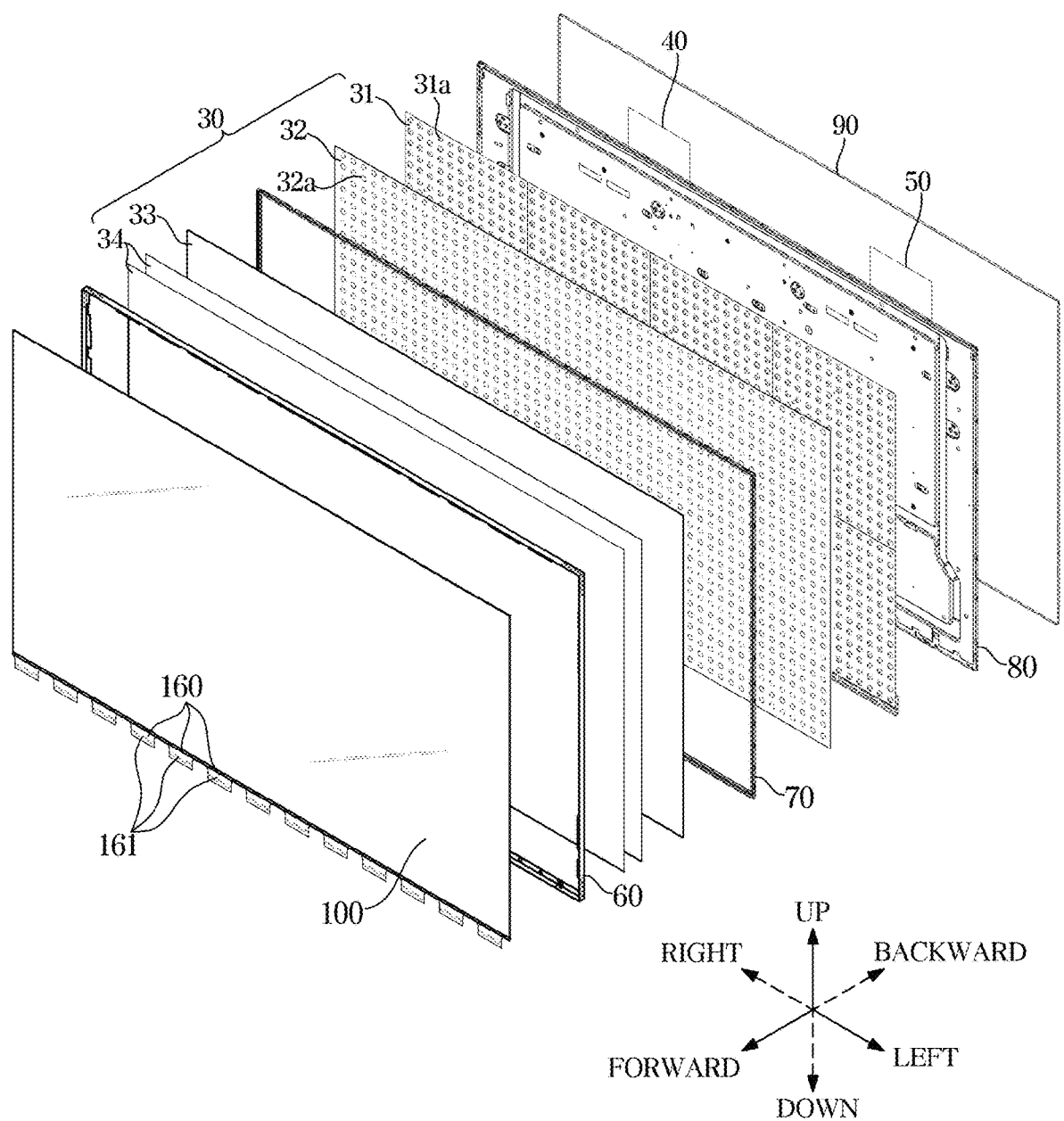
FIG. 2 shows an example of a structure of a display apparatus, according to an embodiment of the disclosure.
Figure 4:
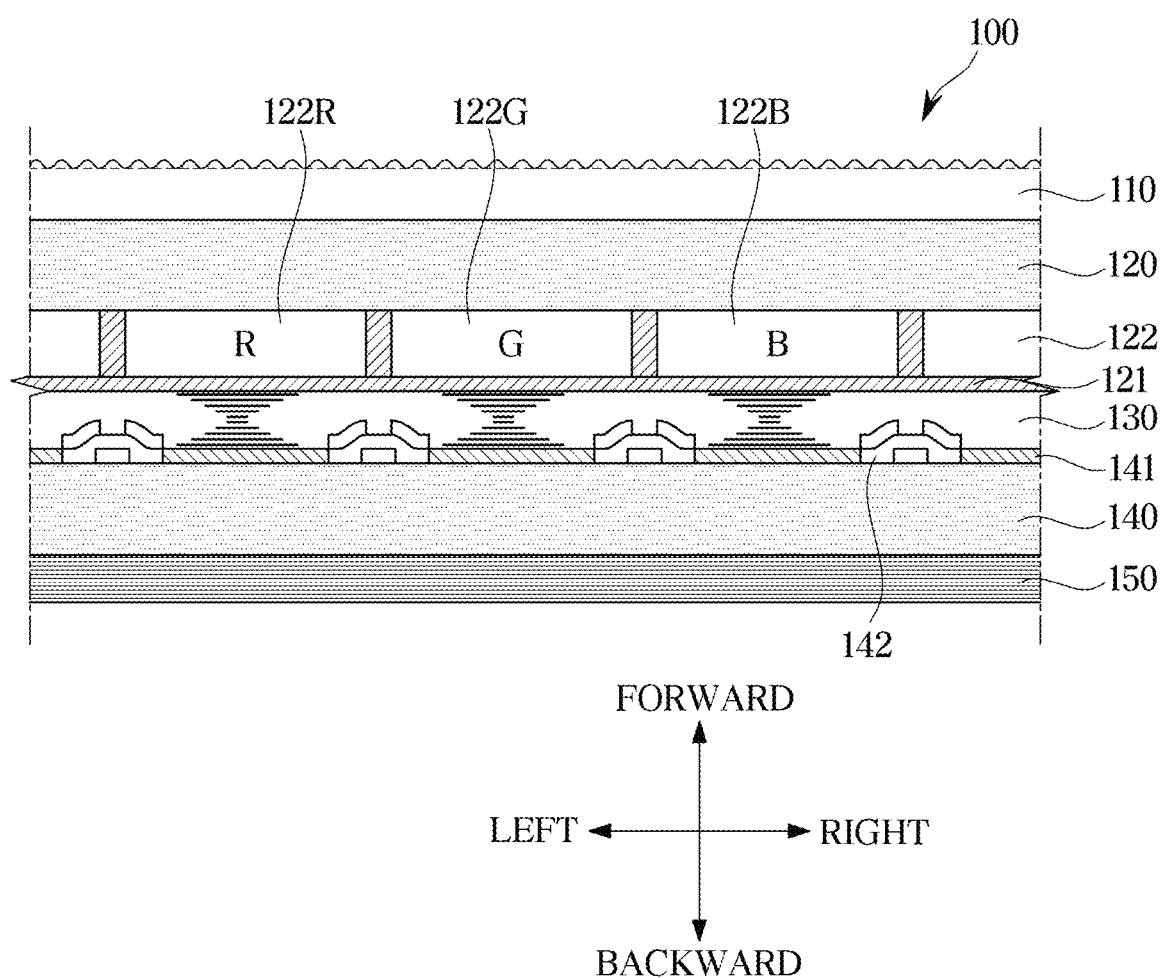
FIG. 4 is a cross-sectional view of the liquid crystal panel taken along line C-C' in FIG. 3, according to an embodiment of the disclosure.

FIG. 2 shows an example of a structure of a display apparatus, according to an embodiment of the disclosure. FIG. 3 shows an example of a liquid crystal panel included in a display apparatus, according to an embodiment of the disclosure. FIG. 4 is a cross-sectional view of the liquid crystal panel taken along line C-C' in FIG. 3, according to an embodiment of the disclosure.

As shown in FIG. 2, the main body 10 may contain many different kinds of components to create the image on the screen 11.

For example, a backlight unit (BLU) 30, which is a surface light source, a liquid crystal panel 100 for blocking or passing the light emitted from the BLU 30, a control assembly 40 for controlling operations of the BLU 30 and the liquid crystal panel 100, and a power assembly 50 for supplying power to the BLU 30 and the liquid crystal panel 100 are equipped in the main body 10.

The BLU 30 may include a light source module 31 for emitting light, a reflection sheet 32 for reflecting light, a diffuser plate 33 for uniformly diffusing light, and an optical sheet 34 for enhancing brightness of output light.

The light source module 31 may include a plurality of light sources 31a for emitting light, and a substrate for supporting/fixing the plurality of light sources 31a.

The plurality of light sources 31a may be arranged in a predefined pattern to emit light with uniform brightness. The plurality of light sources 31a may be arranged such that a light source is equidistant from its neighboring light sources.

For example, the plurality of light sources 31a may be arranged in rows and columns. Accordingly, the plurality of light sources 31a may be arranged such that neighboring four light sources form substantially a square. Furthermore, a light source is located to be adjacent to four other light sources, and the distances between the light source and the four neighboring light sources may be substantially the same. The arrangement of the plurality of light sources 31a is not, however, limited thereto, and the plurality of light sources 31a may be arranged in various ways to emit light in uniform brightness.

The light sources 31a may include a device (e.g., an LED) capable of emitting monochromatic light (light having a wavelength in a particular range or light having a peak wavelength, e.g., blue light) or white light (light having a plurality of peak wavelengths, e.g., a mixture of red light, green light, and blue light) to various directions when powered.

The substrate may fix the plurality of light sources 31a to prevent the light sources 31a from being moved. In addition, the substrate may supply power to each of the light sources 31a so that the light source 31a may emit light.

The reflection sheet 32 may reflect light emitted from the plurality of light sources 31a to a forward direction or to a nearly forward direction.

A plurality of through holes 32a are formed on the reflection sheet 32 at positions respectively matching the plurality of light sources 31a of the light source module 31. Furthermore, the light sources 31a of the light source module 31 may pass the through holes 32a and protrude forward from the reflection sheet 32. Accordingly, the plurality of light sources 31a may emit light from the front of the reflection sheet 32. The reflection sheet 32 may reflect the light emitted toward the reflection sheet 32 from the plurality of light sources 31a toward the diffuser plate 33.

The diffuser plate 33 may be arranged in front of the light source module 31 and the reflection sheet 32. The diffuser plate 33 is able to uniformly diffuse the light emitted from the light sources 31a of the light source module 31. To eliminate the difference in brightness caused by the plurality of light sources 31a, the diffuser plate 33 may diffuse the light emitted from the plurality of light sources 31a within the diffuser plate 33. In other words, the diffuser plate 33 may uniformly emit forward the non-uniform light from the plurality of light sources 31a.

The optical sheet 34 may include various films to improve brightness and uniformity in brightness. For example, the optical sheet 34 may include a light conversion film, a diffuser film, a prism film, and a reflective polarizer film, etc.

In this way, the BLU 30 may emit the uniform surface light in a forward direction by refracting, reflecting and diffusing the light emitted from the light sources.

The liquid crystal panel 100 is arranged in front of the BLU 30 for blocking or passing the light emitted forward from the BLU 30 to produce the image.

The front surface of the liquid crystal panel 100 may form the screen 11 of the display apparatus 1, and the liquid crystal panel 100 may include the plurality of pixels P. The liquid crystal panel 100 may block or pass the light from the BLU 30 separately. The light that has passed through the plurality of pixels P may form the image displayed on the screen 11.

For example, as shown in FIGS. 3 and 4, the liquid crystal panel 100 may include a first polarizer member 110, a first transparent substrate 120, a liquid crystal layer 130, a second transparent substrate 140, and a second polarizer member 150. The second polarizer member 150, the second transparent substrate 140, the liquid crystal layer 130, the first transparent substrate 120, and the first polarizer member 110 may be sequentially layered from back to front.

The first and second transparent substrates 120 and 140 may be formed of tempered glass or transparent resin.

A common electrode 121 and color filters 122 may be provided on the first transparent substrate 120, and pixel electrodes 141 and thin-film transistors 142 may be provided on the second transparent substrate 140.

The color filters 122 may include, for example, a red color filter 122R for passing red light, a green color filter 122G for passing green light, and a blue color filter 122B for passing blue light. Furthermore, the red, green, and blue color filters 122R, 122G, and 122B may be arranged side by side. An area occupied by the color filter 122 corresponds to the pixel P as described above. An area occupied by the red color filter 122R corresponds to the red subpixel PR, an area occupied by the green color filter 122G corresponds to the green subpixel PG, and an area occupied by the blue color filter 122B corresponds to the blue subpixel PB.

The pixel electrodes 141 may be arranged on the inner side of the second transparent substrate 140, and the common electrode 121 may be arranged on the inner side of the first transparent substrate 120. The pixel electrodes 141 and the common electrode 121 are formed of a conductive metal material, and may produce an electric field to change the layout of liquid crystal molecules that form the liquid crystal layer 130, which will be described below.

The thin film transistor (TFT) 142 is arranged on the inner side of the second transparent substrate 140. The TFT 142 may be turned on (closed) or turned off (opened) according to image data provided from a panel driver 161. Furthermore, depending on whether the TFT 142 is turned on (closed) or turned off (opened), an electric field may be formed or removed from between the pixel electrodes 141 and the common electrode 121.

On the outer surfaces of the first and second transparent substrates 120 and 140, the first and second polarizer members 110 and 150 are provided, respectively.

The first and second polarizer members 110 and 150 may each pass particularly polarized light while blocking (reflecting or absorbing) differently polarized light. For example, the first polarizer member 110 may pass polarized light of a first direction while blocking (reflecting or absorbing) differently polarized light. Furthermore, the second polarizer member 150 may pass polarized light of a second direction while blocking (reflecting or absorbing) differently polarized light. The first and second directions may be perpendicular to each other. As a result, the polarized light that has passed the first polarizer member 110 may not directly pass the second polarizer member 150.

The liquid crystal layer 130 may be arranged between the first transparent substrate 120 and the second transparent substrate 140.

The liquid crystal layer 130 is formed between the pixel electrode 141 and the common electrode 121 and filled with the liquid crystal molecules. The liquid crystal molecules may be in an intermediate state between solid (crystal) and fluid. The liquid crystal molecules may reveal an optical property depending on a change in an electric field. For example, the liquid crystal may have varying directions of arrangement of molecules that form the liquid crystal, according to a change in an electric field.

The optical property of the liquid crystal layer 130 may be changed according to whether there is an electric field passing through the liquid crystal layer 130. For example, the liquid crystal layer 130 may rotate a polarization direction of light around a light axis depending on whether there is an electric field. The polarization direction of the polarized light that has passed the first polarizer member 110 may rotate around the light axis while passing through the liquid crystal layer 130, and the polarized light with a rotated polarization direction may pass the second polarizer member 150.

The display apparatus 1 may include a cable 160 arranged underneath the liquid crystal panel 100 to transmit image data to the liquid crystal panel 100.

The cable 160 may be electrically connected to the pixel electrodes 141 and the TFT 142. Furthermore, the cable 160 may be electrically connected to the control assembly 40 and the power assembly 50. In this way, the cable 160 may electrically connect the control assembly 40 and the power assembly 50 to the second transparent substrate 140.

The cable 160 may include, e.g., a flexible flat cable that is bendable or a film cable.

The display apparatus 1 may include a display driver integrated circuit (DDI) 161 (hereinafter, referred to as a panel driver) arranged to process digital image data and output an analog image signal.

The panel driver 161 may receive image data and power from the control assembly 40 and the power assembly 50 through the cable 160. The panel driver 161 may also provide image data and a driving current to the second transparent substrate 140 of the liquid crystal panel 100 through the cable 160.

The cable 160 and the panel driver 161 may be integrally implemented as a film cable, a chip on film (COF), a table carrier package (TCP), etc. In other words, the panel driver 161 may be arranged on the cable 160. It is not, however, limited thereto, and the panel driver 161 may be arranged on the liquid crystal panel 100.

The control assembly 40 may include a control circuit for controlling operations of the liquid crystal panel 100 and the BLU 30. For example, the control circuit may process a video signal and/or an audio signal received from an external content source. The control circuit may transmit image data to the liquid crystal panel 100, and transmit dimming data to the BLU 30.

The power assembly 50 may include a power circuit for supplying power to the liquid crystal panel 100 and the BLU 30. The power circuit may supply power to the control assembly 40, the BLU 30, and the liquid crystal panel 100.

The control assembly 40 and the power assembly 50 may be implemented by printed circuit boards (PCBs) and various circuits mounted on the PCBs. For example, the power circuit may include a power circuit board, and a capacitor, a coil, a resistor, a processor, etc., which are mounted on the power circuit board. Furthermore, the control circuit may include a control circuit board with a memory and a processor mounted on the control circuit board.

Furthermore, the main body 10 may include a front frame 60, a middle frame 70, a bottom chassis 80, and a rear cover 90 to support the liquid crystal panel 100, the BLU 30, the control assembly 40, and the power assembly 50.

Although an LCD panel including the liquid crystal panel 100 and the BLU 30 has been described, the display apparatus 1 according to an embodiment is not limited to including the liquid display panel. For example, the display apparatus 1 may include an inorganic LED panel, an organic LED panel, a quantum dot display panel, or the like. The display apparatus 1 may include a next generation display panel equipped with an optical film.

Figure 5:
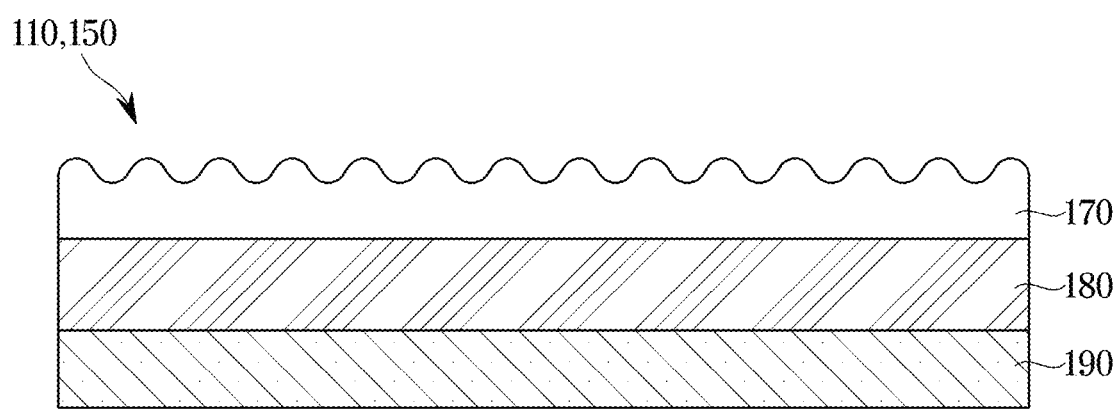
FIG. 5 shows an example of a polarizer member included in a display apparatus, according to an embodiment of the disclosure.

FIG. 5 shows an example of a polarizer member included in a display apparatus, according to an embodiment of the disclosure.

As shown in FIG. 5, the polarizer member 110 or 150 may include a first optical film 170, a polarizer 180, and a second optical film 190.

The first optical film 170, the polarizer 180 and the second optical film 190 may be layered on the first transparent substrate 120 in an order of the second optical film 190, the polarizer 180 and the first optical film 170. In other words, referring to FIG. 5, the first optical film 170 and the second optical film 190 may be provided on upper and lower sides of the polarizer 180, and the second optical film 190 of the polarizer member 110 or 150 may be attached to the first transparent substrate 120.

The polarizer 180 may pass polarized light of a set direction while blocking (reflecting or absorbing) differently polarized light.

The polarizer 180 may include, for example, a poly vinyl alcohol (PVA) film dyed with iodine or dichroic dye molecules.

The uniaxially elongated PVA film may be dyed or impregnated with iodine or a dichroic dye molecule solution. In this case, iodine molecules or dichroic dye molecules may be arranged side by side in the elongated direction of the PVA film, and accordingly, the PVA film may have polarization properties.

As the polarizer 180, the PVA film has characteristics such as superior linearity, film formability, high crystallinity, superior alkali resistance to withstand even at pH 13.5 or higher, superior adhesiveness, etc. To prevent deformation of the polarizer 180 due to high sublimability and low durability of iodine or dichroic dye molecules, the films 170 and 190 may be attached to either surface (inner surface and outer surface) of the polarizer 180.

The second optical film 190 may be arranged on the inner side of the polarizer 180 (i.e., between the polarizer and the transparent substrate) to protect the polarizer 180. The second optical film 190 may be attached to the first transparent substrate 120.

For example, the second optical film 190 may include a tri-acetyl cellulose (TAC) film having good physical and optical characteristics.

The TAC film has superior characteristics such as superior transparency, smoothness, optical isotropy, etc. In the TAC film, the acetyl group of TAC increases the free volume of the molecules, thereby increasing the absorption rate and the smoothness. Furthermore, as the acetyl group hardly makes birefringence even when a main chain is oriented, superior optical isotropy may be revealed.

The TAC film included in the second optical film 190 may enhance the strength of the polarizer member 110 or 150 and protect the polarizer 180 from heat or moisture.

Especially, birefringence may not occur on the TAC film due to the optical isotropy of the TAC film, which may lead to prevention of color mura caused by birefringence on the display panel including the TAC film.

The TAC film may be manufactured by a known manufacturing process, so the description of the manufacturing of the TAC film will be omitted.

In another example, the second optical film 190 may include a phase retardation film that changes a polarization state of light using the birefringence phenomenon.

The phase retardation film may also be referred to as a wave plate, and may change the polarization direction using a difference in speed between a normal ray and an abnormal ray separated by the birefringence.

A full-wave plate may change the polarization direction by 180 degrees, and a half-wave plate may change the polarization direction by 90 degrees.

A quarter-wave plate may change the polarization direction by 45 degrees. On the quarter-wave plate in particular, the first polarized light may overlap with polarized light with a polarization direction changed by 45 degrees. Hence, the linearly polarized light that has passed the quarter-wave plate may be changed to rotate circularly polarized light.

This phase retardation film may block reflection of external light together with the polarizer 180. For example, the external light entering the screen 11 of the display apparatus 1 may become linearly polarized light, and the polarization direction of the polarized light may be changed by 45 degrees due to the phase retardation film. The polarized light with the changed polarization direction may reflect in the liquid crystal panel 100 (e.g., at a metal electrode), and the reflecting polarized light may have a polarization direction that is changed again by 45 degrees due to the phase retardation film. The polarization direction of the reflecting light is different from the polarization direction of the polarizer 180 by 90 degrees, and the light reflecting from the display apparatus 1 may be blocked by the polarizer 180.

The phase retardation film may be manufactured by a known manufacturing process, so the description of the manufacturing of the phase retardation film will be omitted.

The first optical film 170 may be arranged on the outer side of the polarizer 180 (i.e., between the polarizer and the outside) to protect the polarizer 180.

For example, the first optical film 170 may include a biaxially elongated polyethylene terephthalate (PET) film.

The biaxially elongated PET film may have many advantages such as high mechanical intensity, waterproofness, scratch-resistant properties, inexpensive price, etc. However, the biaxially elongated PET film has birefringence properties due to optical isotropy. Especially, the biaxially elongated PET film may have color mura due to birefringence on the display panel including the biaxially elongated PET film because the biaxially elongated PET film has non-uniform birefringence characteristics.

In an embodiment, the first optical film 170 of the display apparatus 1 may further include an additional film or additional layer to prevent the color mura caused by the birefringence characteristics of the biaxially elongated PET film.

Figure 6:
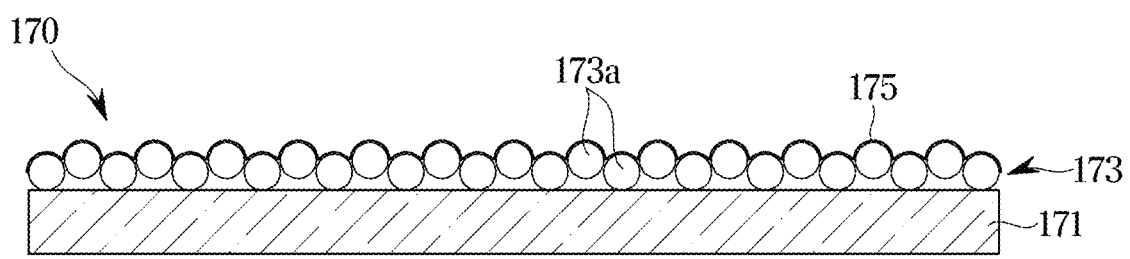
FIG. 6 shows an example of a first optical film included in a display apparatus, according to an embodiment of the disclosure.
Figure 7:
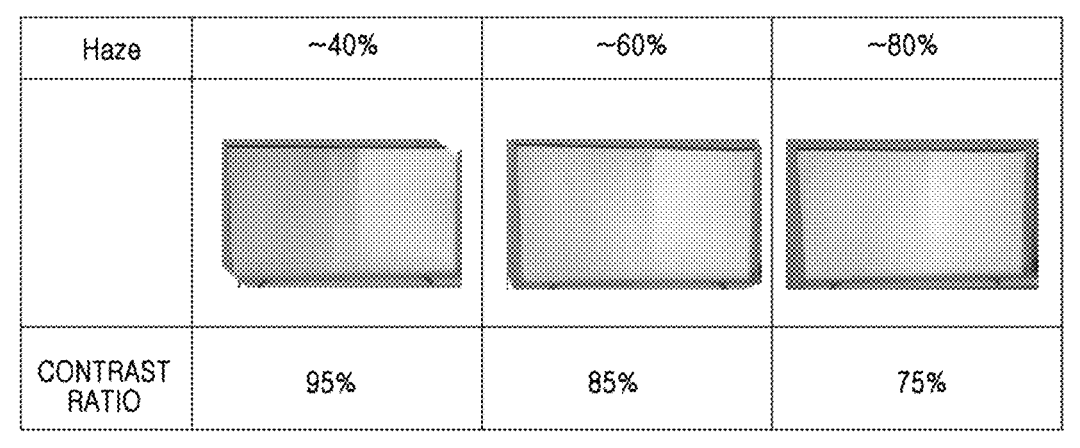

FIG. 6 shows an example of a first optical film included in a display apparatus, according to an embodiment of the disclosure. FIG. 7 shows an example of color mura and contrast depending on haze values of the first optical film included in a display apparatus, according to an embodiment of the disclosure.

Referring to FIG. 6, the first optical film 170 may include a base film 171 including a biaxially elongated PET film, a first scattering layer 173 formed on the base film 171 and a low-reflective film 175 coated on the first scattering layer 173.

The base film 171 may include the biaxially elongated PET film to which an ultraviolet (UV) absorber is added.

The PET of the base film 171 may refer to a resin in which 80 mol % or more of the constitutional repeating unit is composed of ethylene terephthalate, and may include constituent units derived from other copolymerization components. The PET may be manufactured by various manufacturing methods such as a direct polymerization method, an ester exchange reaction method, etc.

The raw resin prepared by the manufacturing method as described above may be biaxially elongated to be molded on a film. A PET film with high mechanical strength may be obtained by biaxial stretching treatment. The stretching temperature may be, for example, between 80° C. and 130° C., and the stretching ratio may be, for example, between 2.5 times and 6 times. To reduce distortion of the orientated main axis after elongation, a relaxation treatment and a heat setting treatment may be performed.

A UV absorber may be added to the PET, which is the raw material resin. In addition to the UV absorber, various additives such as lubricants, antiblocking agents, heat stabilizers, antioxidants, antistatic agents, light resistance agents, and impact resistance enhancing agents may be added to the PET as required.

The UV absorber may prevent, suppress, or reduce deterioration of the polarizer 180 or the liquid crystal layer 130 caused by external UV rays.

The UV absorber may include various materials that may act as the UV absorber. For example, as a UV absorber, various polymeric UV absorbers such as benzophenone-based, benzotriazor-based, salicylic acid ester-based, cyanoacrylate-based, benzooxysazine-based, and triazinexmarine copolymer-based UV absorbers may be added to the PET which is the raw material resin.

The first scattering layer 173 may be formed on the base film 171 to prevent, suppress or reduce color mura caused by optical birefringence of the biaxially elongated PET film.

The first scattering layer 173 may include beads, particles or filler (hereinafter referred to as "particles" 173a) for scattering light.

The particles 173a may include inorganic particles and/or organic particles. For example, the particles 173a may include calcium carbonate, barium sulfate, titanium oxide, aluminum hydroxide, silica, glass, talc, mica, white carbon, magnesium oxide, zinc oxide, etc., as inorganic particles. The particles 173a may include resin particles such as melamine beads, polymethyl methacrylate beads, methyl methacrylate/styrene copolymer resin beads, polycarbonate beads, polyethylene beads, polyvinyl chloride beads, silicone resin beads, etc., as organic particles. Furthermore, the particles 173a may include two or more types of particles, and may include both inorganic particles and organic particles.

The particles 173a may have a size (e.g., diameter) of about a few micrometers (um) to tens of micrometers. For example, the size of each of the particles 173a may range from 1 um to 100 um.

The dispersion density of the particles 173a depends on the haze value, and 2 to 5 particles 173a per 1 square millimeter (mm2) may be dispersed.

Although substantially spherical particles 173a are shown in FIG. 6, the shape of the particles 173a is not limited to what is shown in FIG. 6. For example, the particles 173a may have various shapes such as a sphere, an ellipsoid, a cylinder, a polygon, a cube, or a polyhedron.

The first scattering layer 173 may further include a transparent resin for fixing the particles 173a to the base film 171. For example, the transparent resin for fixing the particles 173a to the base film 171 may include a UV curable resin, a thermosetting resin, an electron beam curable resin, or the like.

The particles 173a of the first scattering layer 173 may have a unique refractive index of the particles and may scatter incident light. In other words, the particles 173a may reflect or refract the incident beam in many different directions.

Color mura due to birefringence properties of the base film 171 may be suppressed or reduced by light scattering on the first scattering layer 173.

A degree to which the first scattering layer 173 scatters light may depend on the density of the particles 173a (e.g., the number of particles per unit area) and/or the size of the particles 173a (e.g., a diameter of a spherical particle). For example, when the density of the particles 173a increases, the degree to which the first scattering layer 173 scatters light may increase. Furthermore, with the decrease in density of the particles 173a, the degree to which the first scattering layer 173 scatters light may decrease.

In this case, the degree to which the first scattering layer 173 scatters light may be represented by a haze value. The haze value represents a ratio of diffusely transmitted light among light transmitted through a sample. Light entering the sample may be blocked by being reflected on or absorbed by the sample, or may pass through the sample. Furthermore, the light that has passed the sample may travel in a direction in which the light entered the sample (parallel transmission) or travel in a different direction from the direction in which the light entered the sample (diffused transmission).

In this case, the haze value may be expressed by a ratio of intensity of the diffusely transmitted light to the intensity of light that has passed through the sample (total transmission). The diffusely transmitted light may refer to light traveling in a direction 2 to 2.5 degrees away from the direction in which the light entered the sample.

The haze value of the sample may be used as an indicator of a degree to which the sample diffuses or scatters the light. In other words, the haze value of the first optical film 170 including the first scattering layer 173 may indicate a degree to which the first scattering layer 173 of the first optical film 170 diffuses or scatters the light.

As described above, the first scattering layer 173 may scatter light so as to suppress or reduce color mura caused by the birefringence properties of the base film 171.

In this case, as the haze value of the first optical film 170 including the first scattering layer 173 increases, the color mura on the display apparatus 1 including the first optical film 170 is reduced.

FIG. 7 shows color mura on a display apparatus including a first optical film having a haze value of about 40%, color mura on a display apparatus including a first optical film having a haze value of about 60%, and color mura on a display apparatus including a first optical film having a haze value of about 80%.

As shown in FIG. 7, it may be seen with a naked eye that the color mura on the display apparatus including the first optical film having the haze value of about 60% is smaller than the color mura on the display apparatus including the first optical film having the haze value of about 40%. Furthermore, the color mura on the display apparatus including the first optical film having the haze value of about 80% is smaller than the color mura on the display apparatus including the first optical film having the haze value of about 60%.

As shown in FIG. 7, it is seen that as the haze value of the first optical film 170 increases, the color mura on the display apparatus 1 is relieved.

On the other hand, with the increase in the haze value of the first optical film 170, a contrast ratio and/or sharpness of the display apparatus 1 may be degraded.

For example, light that forms an image on the display apparatus 1 may pass through the first optical film 170. In this case, the first optical film 170 having a high haze value may scatter the light being transmitted. Due to the scattering of the light that forms the image on the surface of the display apparatus 1, the image may be diffused and the contrast ratio and/or sharpness of the image may be deteriorated.

FIG. 7 shows a contrast ratio on the display apparatus including the first optical film having the haze value of about 40% relative to a contrast ratio on a display apparatus (hereinafter, referred to as a conventional apparatus) including a first optical film having a haze value of 0%, a contrast ratio on the display apparatus including the first optical film having the haze value of about 60% relative to the contrast ratio on the conventional display apparatus, and a contrast ratio on the display apparatus including the first optical film having the haze value of about 80% relative to the contrast ratio on the conventional display apparatus.

From what are shown in FIG. 7, the contrast ratio on the display apparatus including the first optical film having the haze value of about 60% is better than the contrast ratio on the display apparatus including the first optical film having the haze value of about 40%. The contrast ratio on the display apparatus including the first optical film having the haze value of about 80% is lower than the contrast ratio on the display device including the first optical film having the haze value of about 60%.

As such, as the haze value of the first optical film 170 increases, the contrast ratio on the display apparatus 1 may decrease.

In light of the color mura and contrast ratios shown in FIG. 7, it is desirable for the first optical film 170 to have a haze value between about 40% and about 60%. Furthermore, when the first optical film 170 has a haze value of about 50%, the reduction in color mura on the display apparatus 1 and the reduction in contrast ratio on the display apparatus 1 may be harmonized.

The low-reflective film 175 may be formed on the particles 173*a* sprayed onto the base film 171 by low-reflective coating or anti-reflective coating on the base film 171 on which the particles 173*a* are dispersed.

The low-reflective film 175 may prevent, suppress or reduce a ghost image that may be created on the screen 11 of the display apparatus 1.

Figure 8:
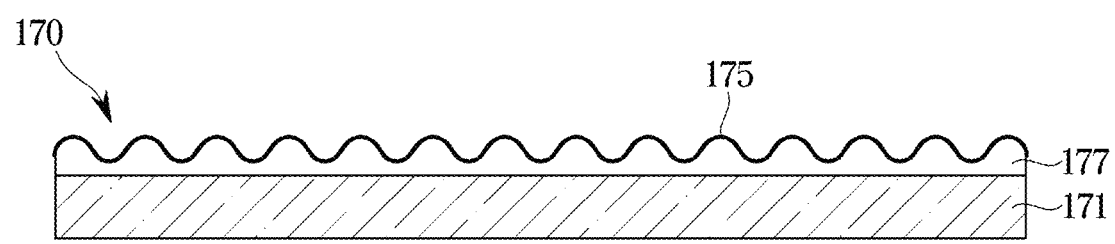
FIG. 8 shows another example of a first optical film included in a display apparatus, according to an embodiment of the disclosure.

FIG. 8 shows another example of a first optical film included in a display apparatus, according to an embodiment of the disclosure.

Referring to FIG. 8, the first optical film 170 may include the base film 171, a second scattering layer 177, and the low-reflective film 175.

The base film 171 may be the same as the base film as shown in FIG. 6.

The second scattering layer 177 is made of a transparent resin, and may have bumps on one surface. The bumps on the second scattering layer 177 may be formed by, for example, an imprinting method.

For example, the second scattering layer 177 may be formed by forming a UV curable resin layer on the surface of the base film 171, pressing the UV curable resin layer with a mold having an uneven surface, and hardening the UV curable resin layer with UV rays while pressing the UV curable resin layer with the mold.

In this case, the type of the photo-curable resin layer may not be limited. The photo-curable resin layer may include a photoinitiator in addition to the UV-light-initiator. For example, the photo-curable resin layer may be a visible-light curable resin layer that may be hardened with visible light.

In another example, the second scattering layer 177 may be formed by forming a thermosetting resin layer on the surface of the base film 171, pressing the thermosetting resin layer with a mold having an uneven surface, and hardening the thermosetting resin layer by cooling while pressing the thermosetting resin layer with the mold.

The low-reflective film 175 may be applied on the second scattering layer 177 by low-reflective coating or anti-reflective coating.

The low-reflective film 175 may be the same as the low-reflective layer as shown in FIG. 6.

Figure 9:
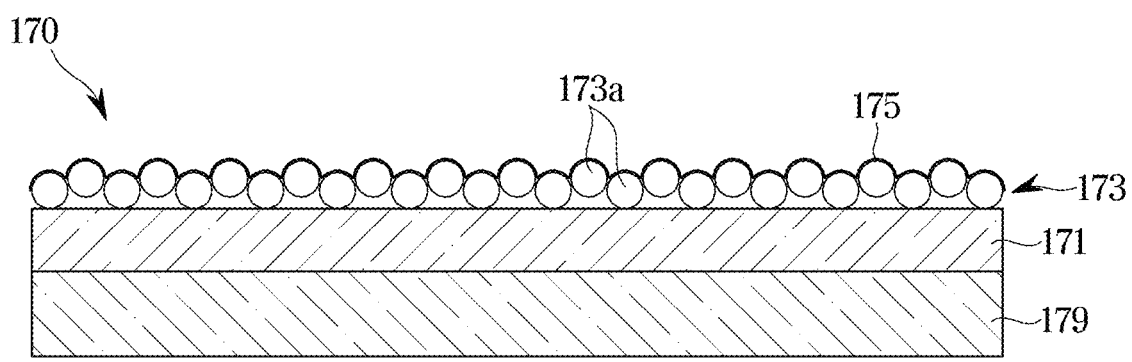
FIG. 9 shows another example of a first optical film included in a display apparatus, according to an embodiment of the disclosure.

FIG. 9 shows another example of a first optical film included in a display apparatus, according to an embodiment of the disclosure.

Referring to FIG. 9, the first optical film 170 may include the base film 171, the scattering layer 173 or 177, the low-reflective film 175 and a viewing angle enhancement film 179.

The base film 171 may be the same as the base film as shown in FIG. 6.

The scattering layer 173 or 177 may include the first scattering layer 173 as shown in FIG. 6, the second scattering layer 177, or a combination thereof.

The low-reflective film 175 may be the same as the low-reflective layer as shown in FIG. 6.

As shown in FIG. 9, the scattering layer 173 or 177 and the low-reflective film 175 may be formed on one surface of the base film 171, and the viewing angle enhancement film 179 may be arranged on the other surface of the base film 171. In other words, the viewing angle enhancement film 179 may be provided opposite the scattering layer 173 or 177 with the base film 171 between the viewing angle enhancement film 179 and the scattering layer 173 or 177.

The viewing angle enhancement film 179 may improve side visibility of the display apparatus 1.

For example, the liquid crystal panel 100 using the optical anisotropy of the liquid crystal layer 130 inevitably causes a difference in image quality between the front and the side in principle. This may degrade side visibility of the display apparatus 1 including the liquid crystal panel 100.

The viewing angle enhancement film 179 for improving side visibility may diffuse or scatter the incident light by forming fine projections on the surface of the film, or may diffuse or scatter the incident light by aligning liquid crystal molecules on the surface.

As shown in FIGS. 6, 8, and 9, the first optical film 170 has optical anisotropy and may include the base film 171 having non-uniform birefringence properties and the scattering layer 173 or 177 formed on the base film 171. The scattering layer 173 or 177 may suppress or reduce color mura caused by the birefringence properties of the base film 171.

This may allow an optical film that suppresses color mura caused by birefringence to be provided at cheaper prices than the existing optical films. In addition, ghost images due to external light reflection are suppressed or reduced, and the image quality of the display apparatus 1 may be improved.

Figure 10:
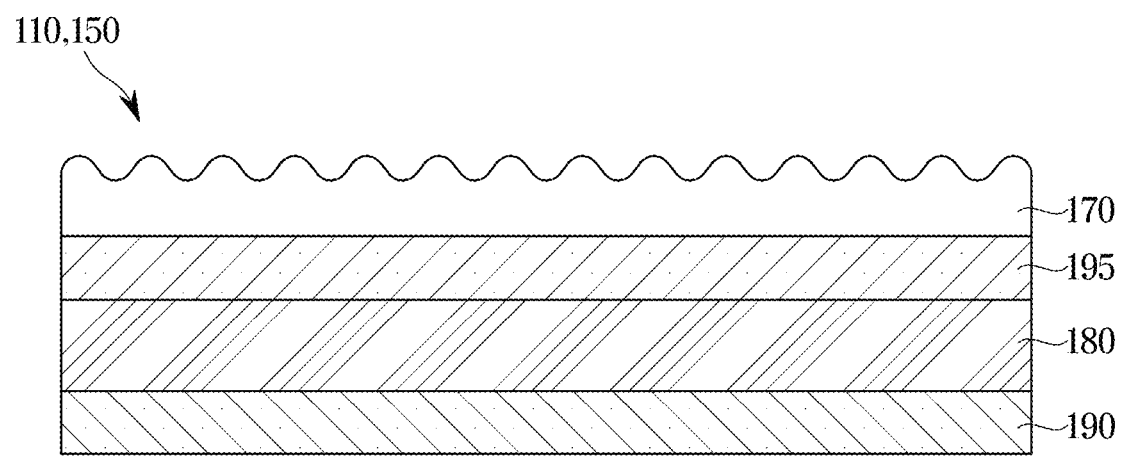
FIG. 10 shows another example of a polarizer member included in a display apparatus, according to an embodiment of the disclosure.

FIG. 10 shows another example of a polarizer member included in a display apparatus, according to an embodiment of the disclosure.

As shown in FIG. 10, the polarizer member 110 or 150 may include a first optical film 170, the polarizer 180, the second optical film 190, and a third optical film 195.

The first optical film 170, the polarizer 180 and the second optical film 190 may be the same as the first optical film, the polarizer and the second optical film as shown in FIG. 5.

The third optical film 195 may be provided between the first optical film 170 and the polarizer 180.

The third optical film 195 may improve mechanical strength of the polarizer member 110 or 150 between the first optical film 170 and the polarizer 180, and prevent deterioration of the polarizer 180.

The third optical film 195 may include a tri-acetyl cellulose (TAC) or a uniaxially elongated PET film.

As described above, the TAC film has superior characteristics such as superior transparency, smoothness, and optical isotropy.

Similar to the biaxially elongated PET film, the uniaxially elongated PET film has many advantages such as high mechanical strength, water resistance, scratch resistance, and inexpensive prices. Unlike the biaxially elongated PET film having non-uniform birefringence characteristics, the uniaxially elongated PET film may not have birefringence characteristics or may have uniform birefringence. This may prevent the color mura from being visibly recognized on the display apparatus 1 caused by the birefringence of the uniaxially elongated PET film.

Furthermore, the uniaxially elongated PET film has UV absorbing characteristics, so the UV absorber may not be added to the base film 171 of the second optical film 190.

As shown in FIG. 10, the polarizer member 110 or 150 may include the first optical film 170 equipped with the base film 171 and the scattering layer 173 or 177, the third optical film 195 comprised of a TAC film or a uniaxially elongated PET film, and the second optical film 190 comprised of a TAC film or a phase retardation film. This may improve mechanical strength and optical properties of the polarizer member 110 or 150 and suppress or reduce color mura on the display apparatus 1.

Figure 11:
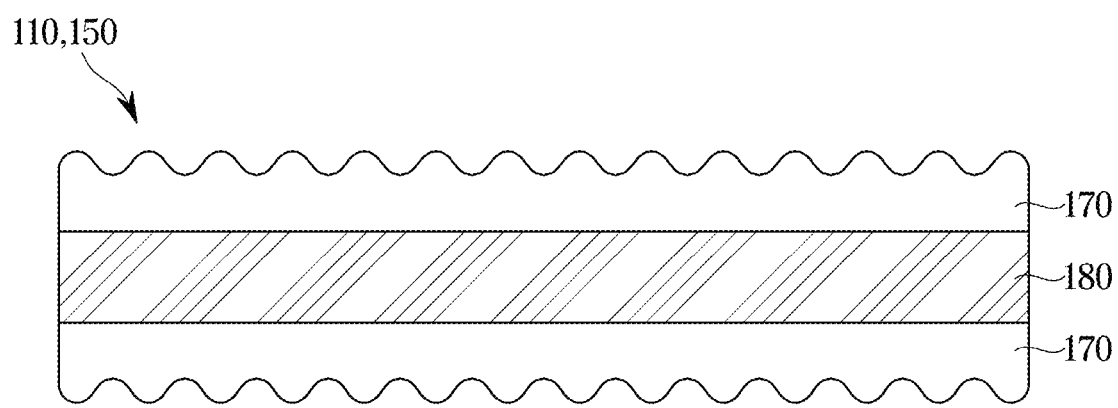
FIG. 11 shows another example of a polarizer member included in a display apparatus, according to an embodiment of the disclosure.

FIG. 11 shows another example of a polarizer member included in a display apparatus, according to an embodiment of the disclosure.

As shown in FIG. 11, the polarizer member 110 or 150 may include the polarizer 180, and the first optical film 170 may be arranged on both surfaces of the polarizer 180.

The first optical film 170 may be the same as the first optical film as shown in FIG. 5. The first optical film 170 may be provided such that the base film 171 or the viewing angle enhancement film 179 is bonded to the polarizer 180.

As such, the polarizer member 110 or 150 may include the polarizer 180 and the first optical film 170 attached onto both surfaces of the polarizer 180. This may suppress or reduce the color mura on the display apparatus 1 and reduce the manufacturing cost of the display apparatus 1.

Although the polarizer member applied to the liquid crystal panel display has been described above, the polarizer member according to an embodiment is not limited to the liquid crystal panel display.

For example, the polarizer member according to an embodiment may be widely applied to an organic LED panel, an inorganic LED panel, or a quantum dot display panel.

Figure 12:
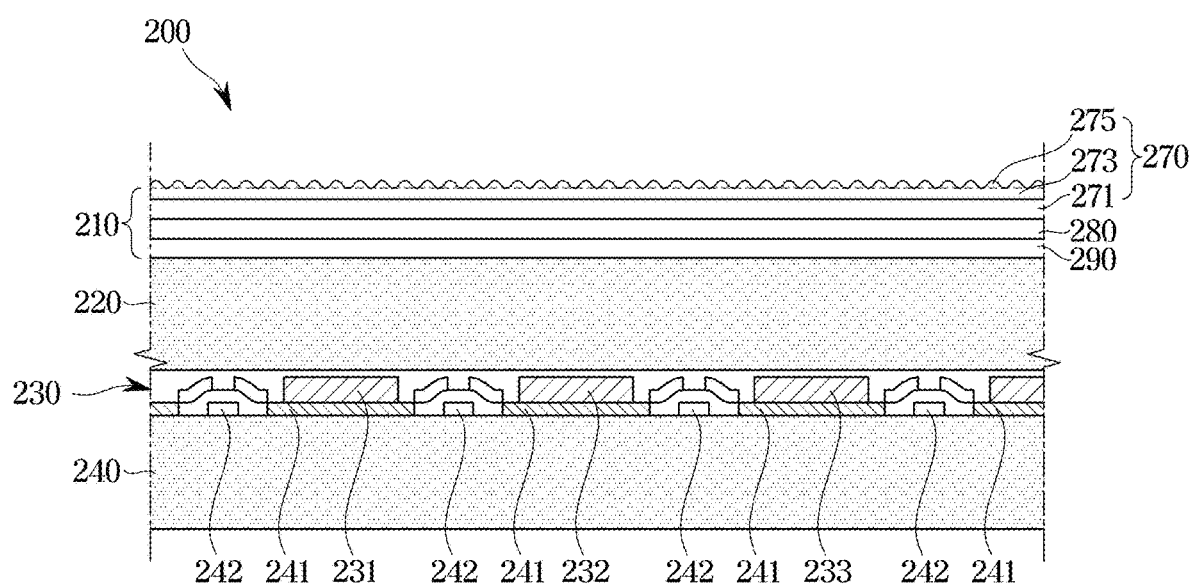
FIG. 12 shows an example of an inorganic light emitting diode (LED) panel including a polarizer member, according to an embodiment of the disclosure.

FIG. 12 shows an example of an inorganic LED panel including a polarizer member, according to an embodiment of the disclosure.

Referring to FIG. 12, an inorganic LED panel 200 is illustrated.

The inorganic LED panel 200 may include a display panel including LEDs made of an inorganic compound. For example, the inorganic LED panel 200 may include a gallium-arsenide (GaAs) compound semiconductor, a gallium-phosphorus (GaP) compound semiconductor, a gallium-nitrogen (GaN) compound semiconductor, a zinc-sulfur (ZnS) compound semiconductor, and a zinc-selenium (ZnSe) compound semiconductor, a silicon-carbon (SiC) compound semiconductor, or the like.

The inorganic LED panel 200 may be manufactured by, for example, transferring LED devices 231, 232 and 233 onto a transparent substrate.

For example, as shown in FIG. 12, the inorganic LED panel 200 may include a polarizer member 210, a first transparent substrate 220, an inorganic light emitting layer 230, and a second transparent substrate 240. The second transparent substrate 240, the inorganic light emitting layer 230, the first transparent substrate 220 and the polarizer member 210 may be sequentially layered from back to front.

The first and second transparent substrates 220 and 240 may be formed of tempered glass or transparent resin.

A driving circuit 241 and a thin film transistor 242 may be provided on the second transparent substrate 240. The driving circuit 241 and the thin film transistor 242 may provide a driving current to the LED devices 231, 232 and 233 arranged on the inorganic light emitting layer 230. For example, the thin film transistor 242 may be turned on (closed) or turned off (opened) according to image data, and accordingly, the LED deices 231, 232 and 233 may be selectively turned on or off.

The inorganic light emitting layer 230 may be provided between the first transparent substrate 220 and the second transparent substrate 240.

The inorganic light emitting layer 230 may include the plurality of LED devices 231, 232, 233. For example, the inorganic light emitting layer 230 may include a red LED device 231 that emits red light, a green LED device 232 that emits green light, and a blue LED device 233 that emits blue light. Furthermore, the red LED device 231, the green LED device 232 and the blue LED device 233 may be arranged side by side on the second transparent substrate 240.

The polarizer member 210 is provided on the outer side of the first transparent substrate 220.

The polarizer member 210 may pass particularly polarized light and block (reflect or absorb) differently polarized light.

The polarizer member 210 may include a first optical film 270, a polarizer 280 and a second optical film 290, as described above in connection with FIG. 5.

The second optical film 290 may include, for example, a TAC film or a phase retardation film. In particular, the phase retardation film may suppress or reduce a ghost image due to reflection of external light by changing the polarization direction of polarized light polarized by the polarizer 280.

The first optical film 270 may include a bass film 271, a scattering layer 273 provided on the base film, and a low-reflective film 275 coated on the scattering layer 273.

The base film 271 may include an inexpensive biaxially elongated PET film having good mechanical properties.

The scattering layer 273 may have a haze value of 40% to 60%, and may suppress or reduce color mura that may be caused by non-uniform birefringence characteristics of the biaxially elongated PET film.

The base film 271, the scattering layer 273 and the low-reflective film 275 may be the same as the base film, the scattering layer and the low-reflective film as shown in FIGS. 6 and 8.

As such, the inorganic LED panel 200 may include an optical film that suppresses color mura caused by the birefringence and has a cheaper price than the optical film in the conventional display apparatus. Furthermore, a ghost image due to reflection of external light may be suppressed or reduced, and image quality on the inorganic LED panel 200 may be improved.

Figure 13:
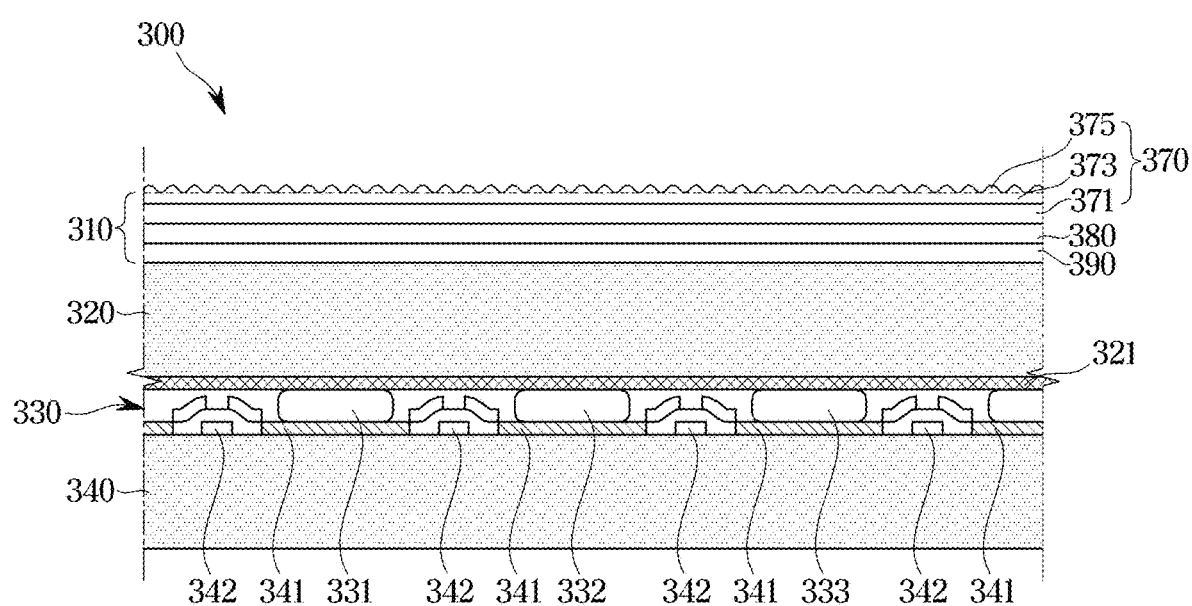
FIG. 13 shows an example of an organic LED panel including a polarizer member, according to an embodiment of the disclosure.

FIG. 13 shows an example of an organic LED including a polarizer member, according to an embodiment of the disclosure.

Referring to FIG. 13, an organic LED panel 300 is illustrated.

The organic LED panel 300 may include a display panel including a light emitting body made of an organic compound. For example, the organic LED panel 300 may include an organic metal compound for a light emitting material.

The organic LED panel 300 may be produced by depositing the organic metal compound on a transparent substrate by using, for example, an inkjet printing technique.

For example, as shown in FIG. 13, the organic LED panel 300 may include a polarizer member 310, a first transparent substrate 320, an organic light emitting layer 330 and a second transparent substrate 340. The second transparent substrate 340, the organic light emitting layer 330, the first transparent substrate 320 and the polarizer member 310 may be sequentially layered from back to front.

The first and second transparent substrates 320 and 340 may be formed of tempered glass or transparent resin. A common electrode 321 may be provided on the first transparent substrate 320, and pixel electrodes 341 and thin-film transistors 342 may be provided on the second transparent substrate 340. The common electrode 321, the pixel electrodes 341 and the thin-film transistors 342 may provide a driving current to light emitting materials 331, 332 and 333 provided on the organic light emitting layer 330.

The organic light emitting layer 330 may be provided between the first transparent substrate 320 and the second transparent substrate 340.

The organic light emitting layer 330 may include the light emitting materials 331, 332 and 333. For example, the organic light emitting layer 330 may include a red light emitting material 331 that emits red light, a green light emitting material 332 that emits green light, and a blue light emitting material 333 that emits blue light. Furthermore, the red light emitting material 331, the green light emitting material 332 and the blue light emitting material 333 may be arranged side by side on the second transparent substrate 340.

The polarizer member 310 is provided on the outer side of the first transparent substrate 320.

The polarizer member 310 may include a first optical film 370, a polarizer 380 and a second optical film 390, as described above in connection with FIG. 5.

The second optical film 390 may include, for example, a TAC film or a phase retardation film. In particular, the phase retardation film may suppress or reduce a ghost image due to reflection of external light by changing the polarization direction of polarized light polarized by the polarizer 380.

The first optical film 370 may include a base film 371 including a biaxially elongated PET film, a scattering layer 373 having a haze value between 40% and 60%, and a low-reflective film 375 coated on the scattering layer 373. The base film 371, the scattering layer 373 and the low-reflective film 375 may be the same as the base film, the scattering layer and the low-reflective film as shown in FIGS. 6 and 8.

As such, the organic LED panel 300 may include an optical film that suppresses color mura due to birefringence and has a lower price than the optical film in the conventional display apparatus. Furthermore, ghost images due to reflection of external light may be suppressed or reduced, and image quality of the organic LED panel 300 may be improved.

Figure 14:
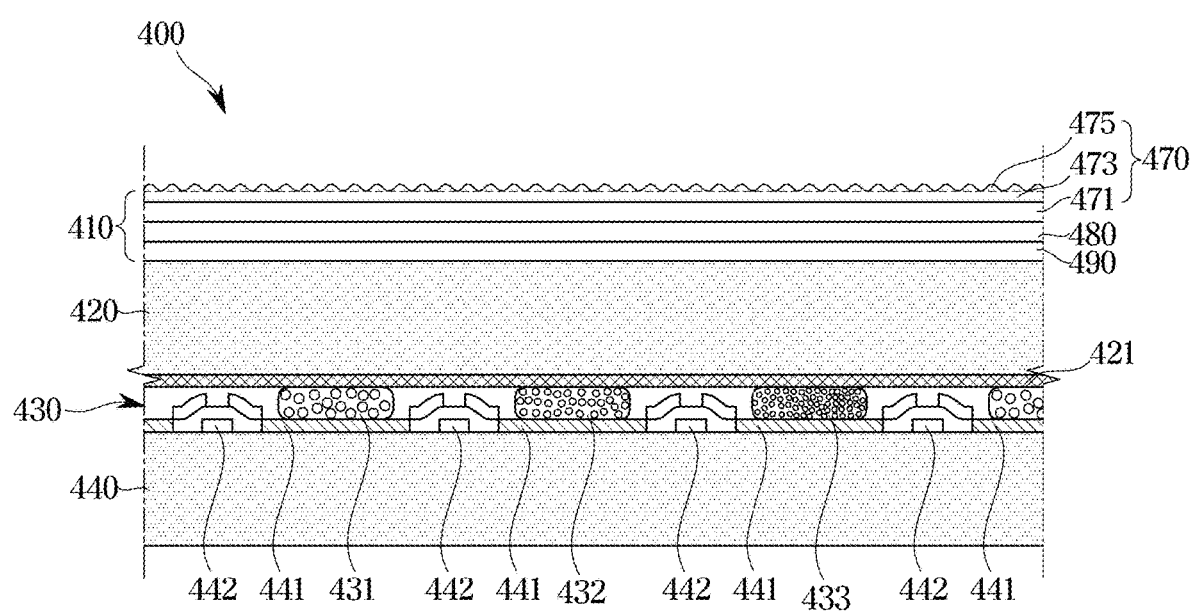
FIG. 14 shows an example of a quantum dot display panel including a polarizer member, according to an embodiment of the disclosure.

FIG. 14 shows an example of a quantum dot display panel including a polarizer member, according to an embodiment of the disclosure.

Referring to FIG. 14, a quantum dot (QD) display panel 400 is illustrated.

The QD display panel 400 may include a display panel including a QD material. For example, the QD material refers to a small spherical semiconductor particle in a nanometer size (nm), and may be comprised of a core body in a size of about 2 nm to 10 nm and an approximately 2 nm to 10 nm and a zinc sulfide (ZnS) shell. Cadmium selenite (CdSe), cadmium telluride (CdTe) or cadmium sulfide (CdS) may be used for the core body of the QD. The QD material may emit light of a specific wavelength by itself when an electric field is applied to the QD material, or may emit light of a specific wavelength when absorbing high-energy light. In this case, the wavelength of the emitted light may depend on the size of the QD material, and the smaller the size, the shorter the wavelength of light emitted, and the larger the size, the longer the wavelength of light emitted.

The QD display panel 400 may be manufactured by depositing the QD material on a transparent substrate by using, for example, an inkjet printing technique.

For example, as shown in FIG. 14, the QD display panel 400 may include a polarizer member 410, a first transparent substrate 420, a QD layer 430 and a second transparent substrate 440. The second transparent substrate 440, the QD layer 430, the first transparent substrate 420 and the polarizer member 410 may be sequentially layered from back to front.

The first and second transparent substrates 420 and 440 may be formed of tempered glass or transparent resin. A common electrode 421 may be provided on the first transparent substrate 420, and pixel electrodes 441 and thin-film transistors 442 may be provided on the second transparent substrate 440. The common electrode 421, the pixel electrodes 441 and the thin film transistors 442 may provide a driving current to QD quantum dot materials 431, 432 and 433 provided on the QD layer 430.

The QD layer 430 may be arranged between the first transparent substrate 420 and the second transparent substrate 440.

The QD layer 430 may include the QD materials 431, 432 and 433. For example, the QD layer 430 may include a red QD material 431 that emits red light, a green QD material 432 that emits green light and a blue QD material 433 that emits blue light. In addition, the red QD material 431, the green QD material 432 and the blue QD material 433 may be arranged side by side on the second transparent substrate 440.

The polarizer member 410 is provided on the outer side of the first transparent substrate 420.

The polarizer member 410 may include a first optical film 470, a polarizer 480 and a second optical film 490, as described above in connection with FIG. 5.

The second optical film 490 may include, for example, a TAC film or a phase retardation film. In particular, the phase retardation film may suppress or reduce a ghost image due to reflection of external light by changing the polarization direction of polarized light polarized by the polarizer 480.

The first optical film 470 may include a base film 471 including a biaxially elongated PET film, a scattering layer 473 having a haze value between 40% and 60%, and a low-reflective film 475 coated on the scattering layer 473.

The base film 471, the scattering layer 473 and the low-reflective film 475 may be the same as the base film, the scattering layer and the low-reflective film as shown in FIGS. 6 and 8.

As such, the QD display panel 400 may include an optical film that suppresses color mura caused by birefringence and has a lower price than the optical film in the conventional display apparatus. Furthermore, ghost images due to reflection of external light may be suppressed or reduced, and image quality of the QD display panel 400 may be improved.

The embodiments of the disclosure have thus far been described with reference to accompanying drawings. It will be obvious to people of ordinary skill in the art that the present disclosure may be practiced in other forms than the embodiments as described above without changing the technical idea or essential features of the present disclosure. The above embodiments are only by way of example, and should not be interpreted in a limited sense.

What is claimed is:

1. A display apparatus comprising:
a display panel comprising a first optical film,
wherein the first optical film comprises:
a biaxially elongated polyethylene terephthalate (PET) film;
a scattering layer provided on the biaxially elongated PET film and having a haze value between 40% and 60%, the haze value representing a scattering rate of light; and
a low-reflective layer provided on the scattering layer,
wherein the scattering layer comprises a plurality of particles dispersed on the biaxially elongated PET film at a dispersion density of 2 to 5 particles per 1 square millimeter.

2. The display apparatus of claim 1, wherein the haze value of the scattering layer is 50%.

3. The display apparatus of claim 1, wherein a size of each of the plurality of particles is between 1 micrometer and 100 micrometers.

4. The display apparatus of claim 1, wherein a surface of the scattering layer comprises a transparent resin having bumps formed thereon by an imprinting method.

5. The display apparatus of claim 1, wherein the scattering layer comprises a thermosetting resin layer.

6. The display apparatus of claim 1, wherein the biaxially elongated PET film comprises an ultraviolet absorber.

7. The display apparatus of claim 1, wherein the first optical film further comprises a viewing angle enhancement film, and
wherein the biaxially elongated PET film is provided on the viewing angle enhancement film.

8. The display apparatus of claim 1, wherein the display panel further comprises:
a second optical film; and
a first polarizer film including a polarizer provided between the first optical film and the second optical film.

9. The display apparatus of claim 8, wherein the display panel further comprises a third optical film provided between the first optical film and the polarizer.

10. The display apparatus of claim 9, wherein the third optical film comprises a tri-acetyl cellulose (TAC) film.

11. The display apparatus of claim 9, wherein the third optical film comprises a uniaxially elongated polyethylene terephthalate (PET) film.

12. The display apparatus of claim 8, wherein the display panel further comprises:
a first transparent substrate;
a second transparent substrate;
a liquid crystal layer provided between the first transparent substrate and the second transparent substrate; and
a second polarizer film provided on an outer side of the second transparent substrate, and
wherein the first polarizer film is provided on an outer side of the first transparent substrate.

13. The display apparatus of claim 12, wherein the second optical film comprises a tri-acetyl cellulose (TAC) film.

14. The display apparatus of claim 8, wherein the display panel further comprises:
a first transparent substrate;
a second transparent substrate; and
an inorganic light emitting layer provided between the first transparent substrate and the second transparent substrate,
wherein the inorganic light emitting layer comprises a plurality of light emitting diode devices, and
wherein the first polarizer film is provided on an outer side of the first transparent substrate.

15. The display apparatus of claim 14, wherein the second optical film comprises a phase retardation film.

16. The display apparatus of claim 8, wherein the display panel further comprises:
a first transparent substrate;
a second transparent substrate; and
an organic light emitting layer provided between the first transparent substrate and the second transparent substrate,
wherein the organic light emitting layer comprises an organic metal compound, and
wherein the first polarizer film is provided on an outer side of the first transparent substrate.

17. The display apparatus of claim 16, wherein the second optical film comprises a phase retardation film.

18. The display apparatus of claim 8, wherein the display panel further comprises:
a first transparent substrate;
a second transparent substrate; and
a quantum dot (QD) layer provided between the first transparent substrate and the second transparent substrate,
wherein the QD layer comprises a plurality of QD materials, and
wherein the first polarizer film is provided on an outer side of the first transparent substrate.

* * * * *